US 6,869,885 B1

United States Patent
Bowling

(10) Patent No.: US 6,869,885 B1
(45) Date of Patent: Mar. 22, 2005

(54) METHOD FOR A TUNGSTEN SILICIDE ETCH

(75) Inventor: Steven Kirk Bowling, San Antonio, TX (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 610 days.

(21) Appl. No.: 09/466,440

(22) Filed: Dec. 17, 1999

(51) Int. Cl.$^7$ .............................................. H01L 21/02
(52) U.S. Cl. ...................... 438/706; 438/710; 438/711; 438/714
(58) Field of Search ................. 438/706, 710, 438/711, 714

(56) References Cited

U.S. PATENT DOCUMENTS

| | | |
|---|---|---|
| 5,112,435 A | 5/1992 | Wang et al. |
| 5,219,485 A | 6/1993 | Wang et al. |
| 5,338,398 A | 8/1994 | Szwejkowski et al. |
| 5,354,417 A * | 10/1994 | Cheung et al. .............. 156/643 |
| 5,411,631 A * | 5/1995 | Hori et al. ..................... 216/72 |
| 5,847,463 A | 12/1998 | Trivedi et al. |
| 6,117,755 A * | 9/2000 | Kun-Yu et al. .............. 438/592 |
| 6,136,211 A * | 10/2000 | Qian et al. ..................... 216/37 |

FOREIGN PATENT DOCUMENTS

| | | |
|---|---|---|
| JP | 04 298035 A | 10/1992 |
| JP | 05 234961 A | 9/1993 |
| JP | 10 214773 A | 8/1998 |

* cited by examiner

*Primary Examiner*—Nadine G. Norton
*Assistant Examiner*—Matthew Song
(74) *Attorney, Agent, or Firm*—Peter Zawilski

(57) ABSTRACT

A tungsten silicide etch process allows for a high etch rate and about 90° sidewall profiles of etched features. According to an example embodiment, a substrate is placed into an etch zone and a process gas comprising $SF_6$, He, HBr, and a chlorine-containing gas is introduced in the etch zone. A plasma is generated in the etch zone to form an etch gas from the process gas that anisotropically etches the tungsten silicide layer.

26 Claims, 3 Drawing Sheets

US 6,869,885 B1

METHOD FOR A TUNGSTEN SILICIDE ETCH

FIELD OF INVENTION

The present invention is generally directed to the manufacture of a semiconductor device. In particular, the present invention relates to a process that enables the etching of tungsten silicide.

BACKGROUND OF INVENTION

The electronics industry continues to rely upon advances in semiconductor technology to realize higher-functioning devices in more compact areas. For many applications, realizing higher-functioning devices requires integrating a large number of electronic devices onto a single silicon wafer. As the number of electronic devices per given area of the silicon wafer increases, the manufacturing process becomes more difficult.

A large variety of semiconductor devices has been manufactured having various applications in numerous disciplines. Such silicon-based semiconductor devices often include metal-oxide-semiconductor MOS) transistors, such as P-channel MOS (PMOS), N-channel MOS (NMOS) and complementary MOS (CMOS) transistors, bipolar transistors, BiCMOS transistors.

Each of these semiconductor devices generally includes a semiconductor substrate on which a number of active-devices are formed. The particular structure of a given active device can vary between device types. For example, in a MOS transistor, an active device generally includes a source and drain region and a gate electrode. The gate modulates current between the source and drain regions.

One important step in the manufacturing of such semiconductor devices is the formation of active devices, or portions thereof, using photolithography and etching processes. In photolithography, a wafer substrate is coated with a light-sensitive material called photo-resist. Next, the wafer is exposed to light; the light striking the wafer is passed through a mask plate. This mask plate defines the desired features to be printed on the substrate. After exposure, the resist-coated wafer substrate is developed. The desired features as defined on the mask are retained on the photoresist-coated substrate. Unexposed areas of resist are washed away with a developer. The wafer having the desired features defined is subjected to etching. Depending upon the production process, the etching may either be a wet etch, in which liquid chemicals are used to remove wafer material or a dry etch, in which wafer material is subjected to a radio frequency (RF) induced plasma. The features required on an integrated circuit are built with a number of thin films. The reliable formation of thin films with the desirable characteristics of resistivity, adhesion, and topology presents a challenge. One group of thin films is refractory silicides, needed as the process scales downward into the sub-micron realm As minimum geometries decrease, interconnect resistances increase. For technologies with minimum geometries of about half a micron, introducing a refractory metal polycide process significantly lowers gate interconnect resistance. In minimum geometry features, tungsten silicide and molybdenum silicides are the materials of choice for their low sheet resistances and thermal stability. The development of Self-Aligned silicide (SALICIDE) technology has allowed further reductions in minimum geometries with increased performance specifications. With salicide technology, not only is the gate interconnect resistance reduced, source-drain interconnect and external transistor resistances are reduced as well because all exposed silicon regions are silicided at the same time. This provides substantial circuit performance increases. While there has been some work on other silicides, much of the development of high performance CMOS circuits centers on titanium silicide. Tungsten is often chosen for its low resistivity. Tungsten can be silicided at temperatures normally found in semiconductor processing because its thermal stability is compatible with semiconductor processing. Etches that are selective to tungsten's silicides are known in the art.

Silicide films are used to provide low resistance interconnection paths which are important in order to fabricate dense, high performance devices. One structure is a polycide gate of the MOS transistor. It consists of a refractory metal silicide (e.g., $WSi_2$, $TiSi_2$, $MoSi_2$, or $TaSi_2$) on top of a doped poly-silicon layer. In an example process, such a structure reduces the interconnect resistivity to less than the 15–30 ohms/square exhibited by doped poly-silicon that has no silicide. One commonly used silicide is tungsten silicide, $WSi_2$.

Reactive Ion Etching (RIE) is often used to selectively etch a substrate on which the desired features of the integrated circuit have been defined through photolithography. The etching begins by introducing a process gas into a chamber. A plasma is ignited in the chamber to create an etch gas from the process gas. The etch gas etches the substrate to create volatile etch byproduct compounds. These compounds are then removed from the chamber. RIE is sometimes used to etch tungsten silicide.

An example prior art recipe for RIE etching $WSi_2$ is a mixture of $SF_6$, HBr, and an inert gas such as He. A significant shortcoming of this recipe is that it may make it difficult to attain vertical sidewall profiles that approach 90°. Ideally, the 90° profile is obtained when the process gas anisotropically etches the substrate and etching proceeds vertically through the uncoated portions of the substrate. A typical sidewall profile angle $\theta$ is about 75°. It is desirable to achieve a sidewall profile angle of more than 80° and preferably, in the range of about 85° to 90°.

The etch chemistry should not undercut features below the resist layer, as this often results in "reentrant" in sidewall profiles that form angles less 85° with the substrate. Reentrant profiles are caused by isotropic etching or undercutting, which occurs when etching proceeds horizontally below the resist layer, instead of vertically through the uncoated portions. Such reentrant profiles can sometimes be created as a result of RIE etching.

RIE systems may cause high profile "microloading." High profile microloading occurs when the cross-sectional profiles of the features vary as a function of the spacing between them. Advantageous etching processes provide features with uniform cross-sections regardless of the distance between the features or their density.

It is also advantageous to obtain high etch rates and high etching selectivity ratios for process efficiency. A high selectivity ratio is desirable to avoid excessive etching of the resist layer that can result in etching of the substrate below the resist layer. The etch selectivity ratio is the ratio of the $WSi_2$ etch rate to the resist etch rate. The selectivity ratio of tungsten silicide to the underlying doped poly-silicon layer is ideally one to one. This targeted ratio minimizes the effect of the non-uniformity of the tungsten silicide etch process, which for some process parameters can be large.

Accordingly, there is a need for a process to selectively etch tungsten silicide on semiconductor substrates that provides substantial anisotropic etching and reduced profile micro-loading. It is also desirable to obtain high etch rates and a high substrate-to resist-etch selectivity ratio. In addition, process non-uniformity should be low or the selectivity to poly-silicon should approach one to one.

SUMMARY OF INVENTION

A number of implementations exemplify the present invention one of which is summarized below. According to one embodiment, there is a method selectively etches a substrate having a tungsten silicide layer with a resist material on portions of the tungsten silicide. First, a process gas comprising $SF_6$, He, HBr, and a chlorine-containing gas is introduced onto the substrate. The volumetric flow ratio of $SF_6$:He, $SF_6$HBr, $SF_6$:chlorine-containing gas is are 1:5.5, 1:1.3, and 1:1, respectively. A plasma is generated and an etch gas is formed from the process gas, and the tungsten silicide layer on the substrate is selectively etched.

The above summary of the present invention is not intended to represent each disclosed embodiment, or every aspect, of the present invention. Other aspects and example embodiments are provided in the figures and the detailed description that follows.

BRIEF DESCRIPTION OF THE DRAWINGS

The invention may be more completely understood in consideration of the following detailed description of various embodiments of the invention in connection with the accompanying drawings, in which.

Figure 1:
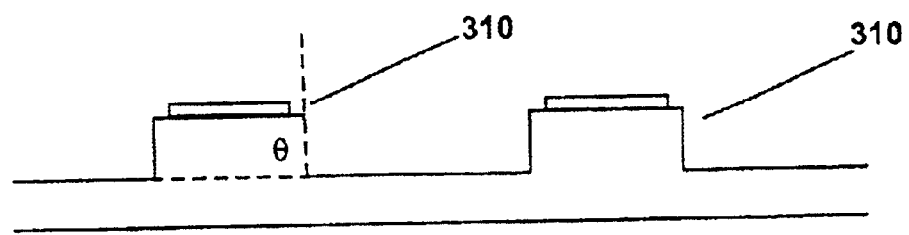
FIG. 1 is a view in cross-section of a substrate having a tungsten silicide layer with a 90° profile angle according to an example embodiment of the present invention.

While the invention is susceptible to various modifications and alternative forms, specific embodiments thereof have been shown by way of example in the drawings and will herein be described in detail. It should be understood, however, that it is not intended to limit the invention to the particular forms disclosed, but on the contrary, the intention is to cover all modifications, equivalents, and alternatives falling within the spirit and scope of the invention as defined by the appended claims.

DETAILED DESCRIPTION

The present invention is believed to be useful in a variety of semiconductor processes in which etching tungsten silicide is beneficial. Various embodiments of the invention are particularly useful and advantageous in connection with a process that minimizes the undercutting of features and achieves a substantially vertical profile while maintaining high selectivity during an etch process having a high etch rate. While the present invention is not necessarily limited to such processes, various aspects of the invention may be appreciated through a discussion of various examples using this context.

An example process selectively etches a substrate having a resist material on portions of a tungsten silicide layer by using a process gas comprising $Cl_2$, HBr, $SF_6$, and He. Wafers are loaded into a suitable etch chamber, such as those manufactured by Applied Materials Corporation or Lam Research Corporation. The etch chamber is sealed and pumped down to a vacuum condition, and the process gas is introduced into the etch chamber. A plasma is generated in the etch chamber from the process gas and forms an etch gas that selectively etches the substrate in the etch chamber at a high etch rate. The plasma is switched off when the endpoint of the process is reached. The etch chamber is evacuated of spent process gases, and the vacuum is released. The wafers are then removed for subsequent processing. An example resulting wafer profile is shown in FIG. 1, wherein the sidewall profile has an angle "θ" in the range of about 85° to 90° at edge 310 of the etched wafer structure 300.

Figure 2A:
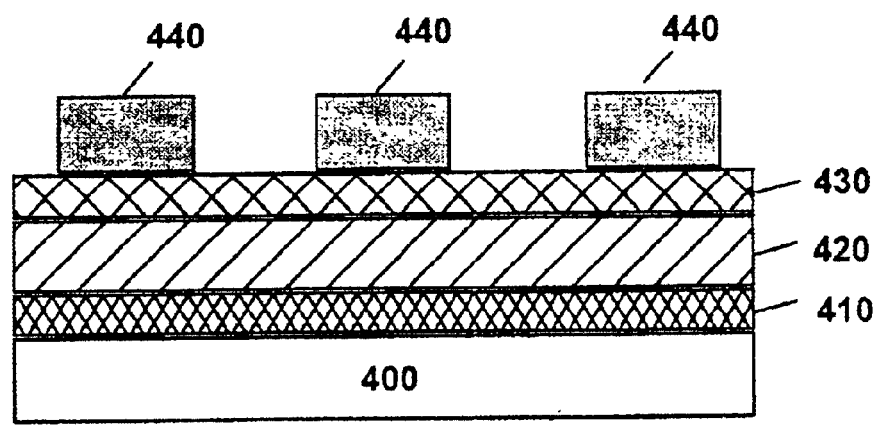
FIG. 2A is a cross-sectional view of a substrate having a tungsten silicide layer before etch.
Figure 2B:
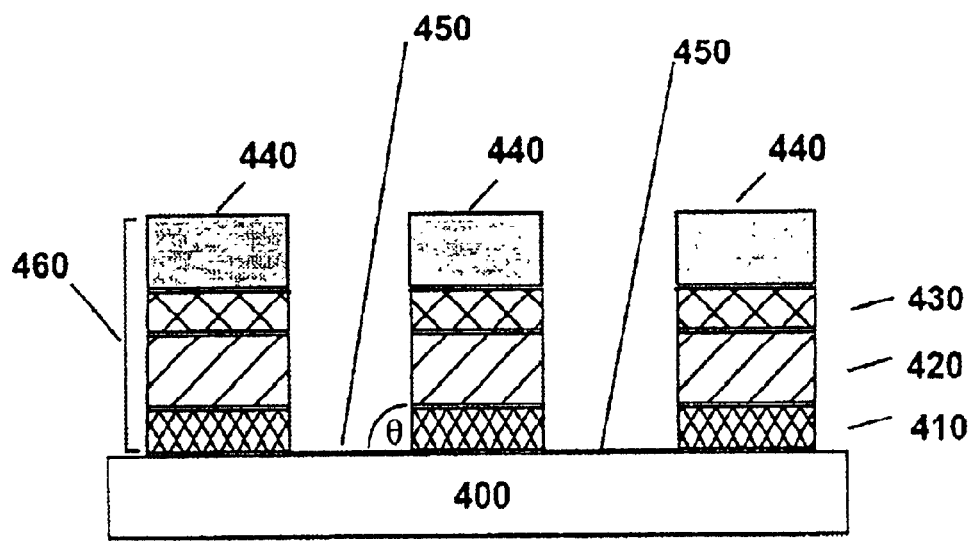
FIG. 2B is a view of FIG. 2A after etch according to another example embodiment of the present invention.

FIGS. 2A–2B illustrate process steps for etching a semiconductor substrate wherein a straight wall profile is attained, according to an example embodiment of the present invention. Typically, the substrate 400 is a semiconductor wafer including materials such as silicon or gallium arsenide, and may also include other material such as metal, glass, or ceramic material. A plurality of layers 460 including a lower layer 410, a middle layer 420, and an upper layer 430 are formed upon the substrate 400. The layers may include, for example, oxide, nitride, and silicide. In one example implementation of the present invention, a gate structure of a MOS transistor is etched wherein the lower layer 410 is an oxide, the middle layer 420 is poly-silicon, and the upper layer 430 is tungsten silicide. The tungsten silicide layer has a composition of $WSi_x$ with x being about 2. In another implementation, the $WSi_x$ layer is non-stoichiometric and can contain other metals or alloys.

According to another example embodiment of the present invention, a resist material 440 is applied to the upper layer 430 of tungsten silicide. The resist material may be a photoresist or a dielectric hardmask substantially resistant to etching. The resist material 440 protects the underlying layers from etch. The upper layer 430 of $WSi_x$, the middle layer 420 of poly-silicon, and the lower layer 410 of oxide are etched down to the substrate 400 in the unmasked regions 450. The remaining features 460 have sidewalls that form angles in the range of about 85° to about 90° with respect to the substrate 400. These features 460 are part of specific portions of the semiconductor device being built. The features have widths or thickness in the range of about 0.20 μm to about 2 μm. Of course, as the process technology evolves, the feature sizes decrease. In addition, the features may be "dense" or closely packed on the substrate with spans among the features being between about 0.5 μm to about 30 μm wide.

Figure 3:
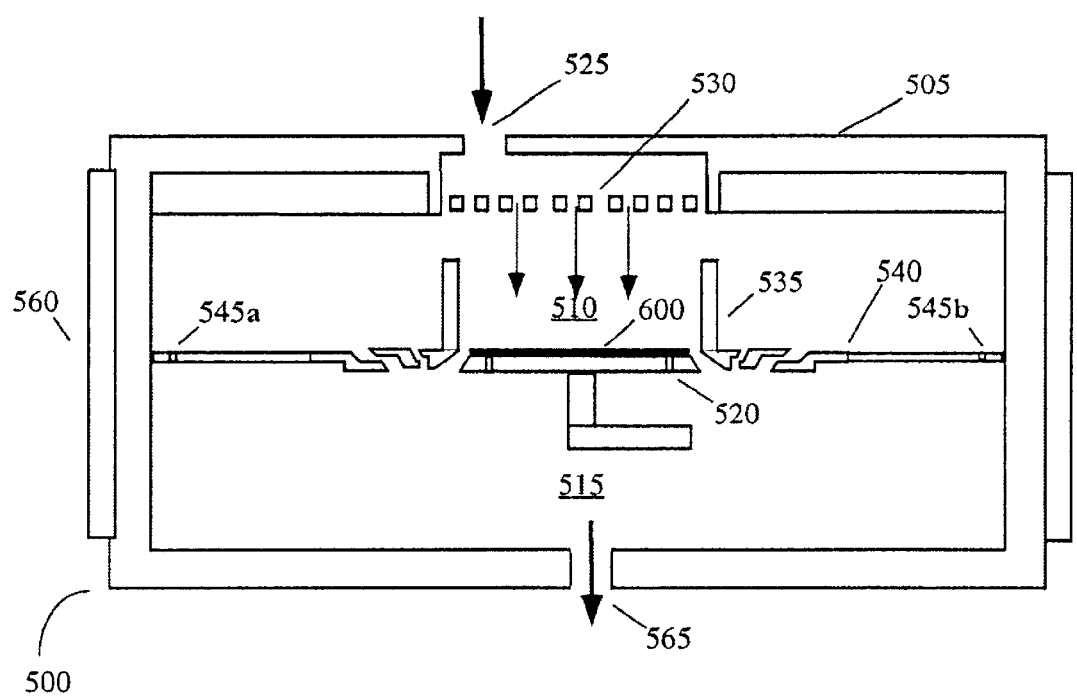
FIG. 3 is a cross-sectional view of an apparatus suitable for performing a tungsten silicide etch, according to another example embodiment of the present invention.

FIG. 3 shows an etch arrangement 500 including an etch chamber 505, according to another embodiment of the present invention. A barrier or pumping plate 540 having exhaust holes 545a and 545b separates the etch chamber 505 into an etching zone 510 and a non-etching zone 515. The exhaust holes 545a and 545b are in fluid communication with a vacuum pump through the exhaust hole 565 for withdrawing spent process gas and volatile etch-byproduct compounds from the etching chamber 505.

A wafer 600 having substrate is placed on a cathode 520 in the etch chamber 505. Process gas is introduced through a gas inlet 525 and into the etch chamber 505. Controls (not illustrated) upstream from the gas inlet 525 blend the constituent mixture of the process gas for a given etch chemistry. The volumetric flow ratio of $SF_6$ to HBr to chlorine-containing gas is adjusted for controlling the composition of the process gas. The volumetric flow ratio is defined as the ratio of the volume per unit time of one gas to the volume per unit time of a second gas and is typically expressed as "standard cubic centimeters per minute" (sccm).

After flowing through the gas inlet 525, the process gas passes through a diffuser plate 530 which distributes the process gas in the etch zone 510. A plasma is generated in the etch zone 510 and forms an etch gas from the process gas. A focus ring 535 can be used to substantially contain the plasma in the etch zone 510. In one particular arrangement, a magnetic coil 560 is activated to enhance the plasma formed in the etching zone 510. The etch gas reaches the surface of the substrate 600 and etches the tungsten silicide.

In one particular example process, the configuration of the etching apparatus enables the user significant flexibility in controlling the etch process, such as for controlling the endpoint of the process. For example, when etching the multiple layers 410, 420 and 430 of FIGS. 2A–2B, the process can be performed in multiple stages. The process conditions for each stage depend upon the composition of the layer that is being etched. Furthermore, when the substrate 400 is etched in multiple stages, the progress of the etch can be observed by monitoring the composition of exhaust gas 420 withdrawn from the chamber. When the composition of the exhaust gas changes, it indicates that one layer has been etched through and the next layer is being etched. During the changeover, the composition of the process gases and other process parameters may be changed to provide greater etching selectivity to the layer that is being etched. In addition, the endpoint of the etch process can be detected by measuring the optical emission of the plasma to determine its composition.

In the above-described example process, the volumetric flow ratio of the $SF_6$:HBr:He:chlorine-containing gas is selected so that the sidewalls 460 of the features defined by masklayer 440 of FIG. 3B form an angle θ of at least about 85° with the substrate substrate 400. The ratio can be selected so that the sidewalls 460 form an angle θ in the range of about 85° to 90° with the substrate 400. The perpendicular sidewalls 460 are desirable for integrated circuit design and performance. Additionally, the $SF_6$:$Cl_2$ ratio is selected to achieve a tungsten silicide etch rate that is greater than about 1500 Å/minute. In one example implementation of the present invention, the $SF_6$:HBr:He:chlorine-containing gas ratio is between about 1:1:2:0.1 and about 1:1.5:4.1:0.1. In another example implementation, the $SF_6$:HBr:He:chlorine-containing gas ratio is between about 1:1.2:5.4:1.2:1 and about 1:1.4:5.6:1. The flow ratio is also selected so that the selectivity of tungsten silicide to doped poly-silicon approaches unity.

In a particular example process, the process gases are blended in a recipe cited in the Table 1 below. The etching apparatus used is a LAM 4420.

TABLE 1

| Pressure (mT) | RF Power Watts | Gap (cm) | $SF_6$ (sccm) | He (sccm) | HBr (sccm) | $Cl_2$ (sccm) |
|---|---|---|---|---|---|---|
| 295 | 415 | 0.85 | 86 | 475 | 114 | 86 |

The process maintains a $Cl_2$ flow rate about equal to that of $SF_6$.

The parameters in Table 1 can vary for various applications of the present invention. For instance, in one particular implementation of the present invention the pressure in the etch zone is between about 150 mT and 350 mT, in another the pressure is between about 200 mT and 300 mT, and in yet another the pressure is between about 200 mT and 325 mT. In another example, the volumetric flow rates of the etch gas components are as follows: the HBr flow rate is between about 90 sccm and 120 sccm; the flow rate of He is between about 375 sccm and 500 sccm; and the flow rate of $SF_6$ and the chlorine-containing gas is between about 65 sccm and about 95 sccm.

While the present invention has been described with reference to several particular example embodiments, those skilled in the art will recognize that many changes may be made thereto without departing from the spirit and scope of the present invention, which is set forth in the following claims.

What is claimed:

1. A method for selectively etching a substrate having a tungsten silicide layer with a resist material on portions of the tungsten silicide layer, the method comprising:

introducing process gas comprising $SF_6$, HBr, He, and a chlorine containing gas onto the substrate, the volumetric flow ratio of $SF_6$:HB ranging from about 1:0.95 to about 1:1.85, and the volumetric flow ratio of the $SF_6$:He ranging from about 1:3.95 to about 1:7.69; the volumetric flow ratio of $SF_6$:chlorine containing gas ranging from about 1:0.68 to about 1:1.46; and generating a plasma to form an etch gas from the process gas, wherein the etch gas selectively etches tungsten silicide layer on the substrate.

2. The method of claim 1, wherein the tungsten silicide layer is etched to form features that have sidewalls and wherein the volumetric flow ratio of the $SF_6$:HBr, the volumetric flow ratio of $SF_6$:He, and the volumetric flow ratio of $SF_6$:chlorine containing gas are selected so that the sidewalls are smooth and form angles of least about 85° with the substrate, 3. The method of claim 1, wherein the volumetric flow ratio of $SF_6$:HBr, the volumetric flow ratio of $SF_6$:He, and the volumetric flow ratio of $SF_6$:chlorine containing gas are selected so that the sidewalls form angles from about 85° to about 90° with the substrate.

4. The method of claim 1 wherein the pressure on the substrate is from about 150 mT to about 350 mT.

5. The method of claim 1 wherein the pressure on substrate is from about 200 mT to about 300 mT.

6. The method of claim 1 wherein the step of introducing a process gas comprises introducing sufficient process gas so that the rate of etching the substrate is greater than about 1500 Å per minute.

7. The method of claim 1, wherein the substrate comprises a semiconductor wafer selected from the group consisting of silicon and gallium arsenide wafers, the wafer having a plurality of layers thereon, the layers being selected from the group consisting of metal, oxide, nitride, silicide, and mixtures thereof.

8. The method of claim 1 wherein the chlorine-containing gas comprises at least one of the following: $Cl_2$, HCl, $CCl_4$.

9. The method of claim 1 wherein the chlorine-containing gas consists of $Cl_2$.

10. A method for selectively etching a substrate having a tungsten silicide layer with a resist material on portions of the tungsten silicide layer, the method comprising:

placing a substrate into an etch zone;

introducing a process gas comprising, the volumetric flow ratio of $SF_6$:HBr ranging from about 1:1.11 to about 1:1.57, the volumetric flow ratio of $SF_6$:He ranging from about 1:4.44 to about 1:6.53; the volumetric flow ratio of $SF_6$:chlorine containing gas ranging from about 1:0.83 to about 1:1.20; and generating a plasma in the etch zone to form an etch gas from the process gas, wherein the etch gas selectively etches the tungsten silicide layer on the substrate.

11. The method of claim 10, wherein the tungsten silicide layer is etch to form features that have sidewalls and wherein the volumetric flow ratio of $SF_6$:HBr, the volumetric flow ratio of $SF_6$:He, and the volumetric flow ratio of $SF_6$:chlorine containing gas are selected so that the sidewalls are smooth and form angles of least about 85° with the substrate.

12. The method of claim 10, wherein the volumetric flow ratio of $SF_6$:HBr, the volumetric flow ratio of $SF_6$:He, and the volumetric flow ratio of $SF_6$:chlorine containing gas are selected so that the sidewalls form angles from about 85° to about 90° with the substrate.

13. The method of claim 10 wherein the pressure in the etch zone is from about 150 mT to about 350 mT.

14. The method of claim 10 wherein the pressure in the etch zone is from about 200 mT to about 325 mT.

15. The method of claim 10 wherein the step of introducing a process gas comprises introducing sufficient process gas so that the rate of etching the substrate is greater than about 1500 Å per minute.

16. The method of claim 10, wherein the substrate comprises a semiconductor wafer selected from the group consisting of silicon and gallium arsenide wafers, the wafer having a plurality of layers thereon, the layers being selected from the group consisting of metal, oxide, nitride, silicide, and the mixtures thereof.

17. The method of claim 10 wherein the chlorine-containing gas comprises at least one of the following: $Cl_2$, HCl, and $CCl_4$.

18. The method of claim 10 where the chlorine-containing gas consists of $Cl_2$.

19. A semiconductor device manufactured according to the method of claim 1, the semiconductor device comprising:

a substrate; and sidewalls having an angle that is between about 85° and about 90° with the substrate.

20. A semiconductor device, according to claim 19, wherein the substrate comprises a plurality of layers.

21. A semiconductor device manufactured according to the method of claim 10, the semiconductor device comprising features including a substrate and sidewalls having an angle that is between about 85° and about 90° with the substrate.

22. A semiconductor device, according to claim 19, wherein the substrate comprises a plurality of layers.

23. A method for selectively etching a substrate having a tungsten silicide layer with a resist material on portions of the tungsten silicide layer, the method comprising:

placing a substrate into an etch zone;

introducing a process gas comprising $SF_6$, He, HBr, and a chlorine containing gas into the etch zone, the volumetric flow ratio of $SF_6$:chlorine containing gas being about one;

generating a plasma in the etch zone to form an etch gas from the process gas, wherein the etch gas selectively etches the tungsten silicide layer on the substrate.

24. A method for selectively etching a substrate having a tungsten silicide layer with a resist material on portions of the tungsten silicide layer, the method comprising:

placing a substrate into an etch zone;

introducing a process gas comprising $SF_6$, He, HBr, and a chlorine containing gas into the etch zone, the volumetric flow rate of HBr is in the range of about 90 sccm to 120 sccm, the volumetric flow rate of He is in the range of about 375 sccm to about 500 sccm, the volumetric flow ratio of $SF_6$:chlorine containing gas being about one, the volumetric flow rate of the chlorine containing gas in the range of about 65 sccm to about 95 sccm; and generating a plasma in the etch zone to form an etch gas from the process gas, wherein the etch gas selectively etches the tungsten silicide layer on the substrate.

25. The method of claim 23 wherein the chlorine-containing gas comprises at least one of the following: $Cl_2$, HCl, $CCl_4$.

26. The method of claim 24 wherein the pressure in the etch zone is from about 150 mT to about 350 mT.

* * * * *